United States Patent [19]

Hattori et al.

[11] Patent Number: 4,521,488

[45] Date of Patent: Jun. 4, 1985

[54] POLYACETAL RESIN COMPOSITION EXCELLENT IN HEAT STABILITY AND SURFACE PROCESSABILITY AND PROCESS FOR SURFACE TREATING SAME

[75] Inventors: Yoshihiro Hattori, Kawasaki; Takashi Watanabe, Ayase; Kunio Maeda, Yokohama, all of Japan

[73] Assignee: Asahi Kasei Kogyo Kabushiki Kaisha, Osaka, Japan

[21] Appl. No.: 571,677

[22] Filed: Jan. 17, 1984

Related U.S. Application Data

[63] Continuation of Ser. No. 251,936, Apr. 7, 1981, Pat. No. 4,464,435, which is a continuation-in-part of Ser. No. 86,534, Oct. 19, 1979, abandoned.

[30] Foreign Application Priority Data

Oct. 25, 1978 [JP] Japan ............................... 53-130479
Aug. 17, 1979 [JP] Japan ............................... 54-104102

[51] Int. Cl.³ ............................................. B32B 15/08
[52] U.S. Cl. .................................... 428/409; 264/129; 264/232; 264/344; 427/307; 428/457
[58] Field of Search ............... 427/307; 264/129, 232, 264/340, 344; 204/38 B; 428/409, 457; 156/668

[56] References Cited

U.S. PATENT DOCUMENTS

| | | | |
|---|---|---|---|
| 3,466,232 | 9/1969 | Frances et al. | 427/307 |
| 3,567,594 | 3/1971 | Wells | 427/307 |
| 3,597,336 | 8/1971 | Sholton et al. | 427/307 |
| 3,899,617 | 8/1975 | Courduvelis | 427/307 |

Primary Examiner—James J. Bell
Attorney, Agent, or Firm—Birch, Stewart, Kolasch & Birch

[57] ABSTRACT

A polyacetal resin composition excellent in heat stability and surface processability which comprises (a) about 100 parts by weight of polyacetal resin, (b) about 2 to about 35 parts by weight of a carbonate, phosphate or acetate of a metal belonging to Group II of the Periodic Table or a mixture thereof and (c) about 0.01 to about 20 parts by weight of a polymer, a copolymer or a mixture thereof of a compound selected from the group consisting of unsaturated polyesters, alkyl esters of acrylic acid or methacrylic acid, amides of acrylic acid or methacrylic acid, triallyl cyanurate, diallyl phthalate, vinyl acetate and divinylbenzene.

11 Claims, 4 Drawing Figures

POLYACETAL RESIN COMPOSITION EXCELLENT IN HEAT STABILITY AND SURFACE PROCESSABILITY AND PROCESS FOR SURFACE TREATING SAME

CROSS REFERENCE TO RELATED APPLICATION

This application is a continuation of U.S. Ser. No. 251,936, filed on Apr. 7, 1981, now U.S. Pat. No. 4,464,435, which in turn is a continuation-in-part of U.S. Ser. No. 86,534, filed on Oct. 19, 1979, now abandoned.

BACKGROUND OF THE INVENTION

1. Field of the Invention

This invention relates to a polyacetal resin composition excellent in heat stability and surface processability.

2. Description of the Prior Art

Generally speaking, plastics are quite stable chemically and molded products thereof made by injection molding or the like have a smooth surface, so that it is difficult to decorate the surface thereof by means of printing, coating, deposition or the like or to subject the surface to processing such as adhesion by means of adhesives. Since polyacetal resin is particularly poor in surface activity and there is known no appropriate solvent having an affinity for polyacetal, the surface decoration and adhesion thereof are difficult to carry out in practice and, thus polyacetal resins are scarcely put to uses requiring such treatments at the present stage. Conversely speaking, since polyacetal resin is excellent in mechanical properties, it is mainly used for mechanical parts or the like in many cases and its surface decoration has not been required hitherto so frequently.

However, the application of plastics has diversified recently and higher class usages are frequently required to simultaneously satisfy plural performances, such as function and appearance or function and adhesion property, of which compatibility has not necessarily been required hitherto. Thus, it is the current trend to require good surface processability even in the application of polyacetal.

Although it is difficult to say that the process for improving surface processability of polyactal has actively been studied hitherto, we are informed of the fact that the surface processability can be improved to some extent by treating the surface of a molded product with an acidic solution or an oxidant solution. As said acidic solution, p-toluenesulfonic acid, camphorsulfonic acid, phosphoric acid, acid ammonium sulfate and the like have been proposed, while as said oxidant solution a chromic acid-sulfuric acid mixture has been proposed.

The object of the treatment with these solutions is considered to consist in producing a rough surface by chemically etching the surface of a molded product of polyacetal resin and simultaneously forming reactive groups on a part of the polyacetal molecule by the oxidizing action of the solutions. In general, if it is attempted to enhance the effect of a surface treatment by means of such a procedure, problems arise such as deterioration of the parent material, i.e. polyacetal resin, throughout the whole of the body of the molded article, the formation of cracks, etc. On the other hand, if the treatment is carried out utilizing a condition which causes no deterioration of the parent material, the effect of the surface treatment is insufficient and a good surface processing cannot be practiced. For these reasons, there has hitherto been known no molded product of polyacetal resin having a sufficient surface processability for practical use.

SUMMARY OF THE INVENTION

It is an object of this invention to provide an acetal resin composition excellent in surface processability and heat stability, as well as to provide a molded product of acetal resin having a roughened surface suitable for plating or coating by the use of said composition.

It is a further object of this invention to provide a process for producing said composition, as well as to disclose a surface treatment process for obtaining said molded product.

Other objects of this invention will become apparent from the description given below.

The present inventors have earnestly studied the composition of polymers with the aim of obtaining a molded product of polyacetal resin excellent in surface processability. As a result, it was found that a composition comprising polyacetal resin, a salt of a metal belonging to Group II of the Periodic Table and a certain kind of polymer exhibits excellent performances in heat stability and surface processability.

Thus, this invention relates to a polyacetal resin composition excellent in heat stability and surface processability which comprises (a) about 100 parts by weight of polyacetal resin, (b) about 2 to about 35 parts by weight of a carbonate, phosphate, acetate or their mixture of a metal belonging to Group II of the Periodic Table, and (c) about 0.01 to about 20 parts by weight of a polymer, copolymer or their mixture of a compound selected from the group consisting of unsaturated polyester, alkyl esters of acrylic or methacrylic acid, amides of acrylic or methacrylic acid, triallyl cyanurate, diallyl phthalate, vinyl acetate and divinylbenzene.

DETAILED DESCRIPTION OF THE INVENTION

Figure 1:
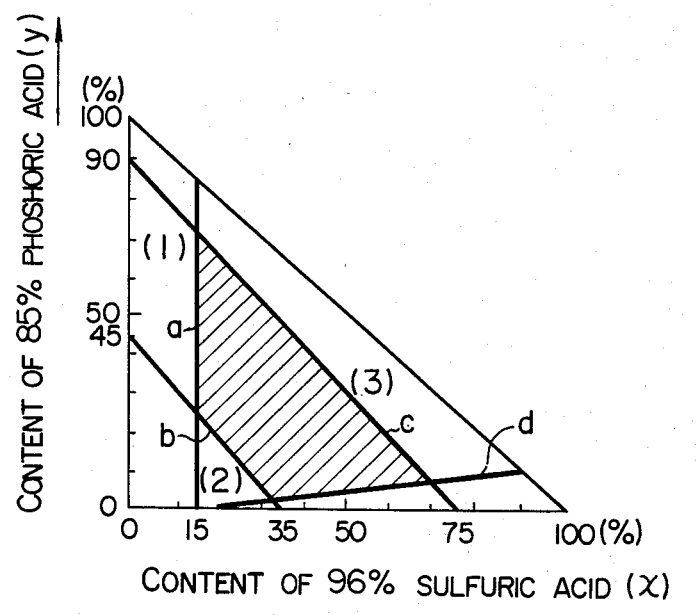
FIG. 1 is a diagram representing the concentrations of sulfuric acid and phosphoric acid in the etching acid solution, wherein the abscissa is the content (%) of 96% by weight sulfuric acid based on water and the ordinate is the content (%) of 85% by weight phosphoric acid based on water, for convenience.

In this invention, the object of adding a salt of a metal belonging to Group II of the Periodic Table to polyacetal resin consists in facilitating the formation of a roughened surface suitable for surface processing. That is to say, if a salt of a metal belonging to Group II of the Periodic Table is dispersed in the continuous phase of polyacetal, it can easily be decomposed and removed with an acid and the mark remains as a roughened surface.

Examples of the metal belonging to Group II of the Periodic Table used in this invention include calcium, magnesium, barium, zinc and the like, and examples of said salt include the carbonate, phosphate, acetate and the like. Among the salts, the salts of calcium, magnesium and barium are preferable and carbonates of these metals are particularly preferable. Particularly, calcium carbonate is most preferable. Among the phosphates, hydrogen phosphates are most preferable.

In the surface treatment, for example plating, of a resin, the specular character of the surface and the adhesion between the plated metal layer and the surface of a resin are frequently fundamentally important characteristics. Further, good heat stability at the time of molding is severely required sometimes. The inventors have studied the relation between these characteristics and the average particle size of various salts of metals belonging to Group II of the Periodic Table to reveal that the metallic salt deteriorates the specular character and adhesion if the average particle size exceeds about 4.0 microns and it deteriorates adhesion and heat stability if the average particle size is smaller than about 0.1 micron. Accordingly, if specular character, adhesion and heat stability are all taken into consideration, the average particle size of the salt of a metal belonging to Group II of the Periodic Table is preferably in the range of about 0.1 to about 4.0 microns and particularly in the range of about 0.5 to about 2.0 microns.

If the amount of salt of a metal belonging to Group II of the Periodic Table is too small, the effect of improving the surface processability cannot be exhibted. If it is too large, the mechanical characteristic properties of polyacetal resin are deteriorated and, simultaneously, the effect of improving surface processability rather drops and heat stability at the time of molding is also deteriorated. Considering these balances, therefore, the amount of the salt is preferably in the range of about 2 to about 35 parts by weight and more preferably in the range of about 2 to about 25 parts by weight per about 100 parts by weight of polyacetal resin.

On the other hand, the inventors conducted extensive studies about this polyacetal resin composition, i.e. various compositions comprising a polyacetal resin and various salts of metals belonging to Group II of the Periodic Table of which the average particle size and amount are in the ranges defined above, to reveal that, in etching a molded product with an appropriate acid, i.e. an acidic solution or an oxidant solution, the molded product itself is cracked, and the specular character and mechanical performances of the plated product are markedly deteriorated if the acidic or oxidant solution is particularly strong and that, if the conditions of molding are not controlled sufficiently at the time of molding, the molded product can sometimes be discolored and streaks of decomposition gas formed by the thermal decomposition of polyacetal resin at the time of molding can sometimes remain in the surface of the molded product.

The inventors conducted further studies with the objective of solving these problems. As the result, it was found that the above-mentioned problems can be overcome by additionally incorporating, into the above-mentioned polyacetal resin composition, a polymer, a copolymer or their mixture of a compound selected from the group consisting of unsaturated polyesters, alkyl esters of acrylic acid or methacrylic acid, amides of acrylic acid or methacrylic acid, triallyl cyanurate, diallyl phthalate, vinyl acetate and divinylbenzene. Based on this finding, the present invention was accomplished.

As said unsaturated polyester, a product obtainable by esterifying an unsaturated dicarboxylic acid or its mixture with a saturated dicarboxylic acid or a saturated or unsaturated monocarboxylic acid with a polyhydric alcohol or its mixture with a monohydric alcohol can be used.

As the acid used for the production of said unsaturated polyester, maleic acid, maleic anhydride, fumaric acid, itaconic acid, citraconic acid, endomethylenetetrahydrophthalic acid and the like can be used as said unsaturated dicarboxylic acid, and o-phthalic acid, phthalic anhydride, isophthalic acid, terephthalic acid, adipic acid and the like can be used as the saturated dicarboxylic acid. Mixtures of two or more members thereof can also be used. As said monocarboxylic acid, acetic acid, propionic acid, butyric acid, benzoic acid, acrylic acid, methacrylic acid and the like can be used, and mixtures of two or more members thereof can also be used. The above-mentioned carboxylic acids may also be supplied in the form of an alkyl ester such as the methyl ester, dimethyl ester or the like.

As said polyhydric alcohol, ethylene glycol, propylene glycol, butanediol, diethylene glycol, dipropylene glycol, glycerin, trimethylolpropane and the like can be used. As said monohydric alcohol, methanol, ethanol, allyl alcohol and the like can be used.

An example of a preferable unsaturated polyester is an esters comprising isophthalic acid, maleic anhydride and diethylene glycol.

Said unsaturated polyester, in order to facilitate its thermosetting, is frequently provided in the form of a mixture with a crosslinking agent having a reactive unsaturated bond, such as, a vinyl monomer or a prepolymer having an unsaturated residue of a vinyl group. As said crosslinking agent, styrene, α-methylstyrene, vinylpyridine, vinylpyrrolidone, vinyl propionate and the like can be used.

When styrene, α-methylstyrene, vinylpyridine, vinylpyrrolidone, vinyl propionate or the like is added as a crosslinking agent, its amount is preferably in the range of about 0.2 time to about 1.0 time the weight of unsaturated polyester or the total weight of unsaturated polyester and other compounds (as has been mentioned above, it is such a range that the weight of unsaturated polyester or the total weight of unsaturated polyester and other compounds becomes about 20 parts by weight or less per about 100 parts by weight of polyacetal resin). In case of use together with the crosslinking agent, said amount of the unsaturated polyester means the amount including that of the crosslinking agent used.

In the component (c) of this invention, when said unsaturated polyester is copolymerized or mixed with other compounds, their proportion may be selected arbitrarily.

As said alkyl ester of acrylic acid or methacrylic acid, those wherein the alkyl group has 1–5 carbon atoms and preferably 1–2 carbon atoms can be suitably used.

In this invention, accordingly, the above-mentioned component (c) to be incorporated into polyacetal resin (a) together with the salt of a metal belonging to Group II of the Periodic Table (b) constitutes an indispensable constructional condition of the invention. The object of adding component (c) will be again summarized hereunder. It is added for the purpose of preventing a molded product from encountering crack formation even when the etching is carried out with a particularly strong acidic solution or oxidant solution and, at the same time, for the purpose of preventing the deterioration of heat stability at the time of molding which may occur when a salt of metal belonging to Group II of the Periodic Table is added to a polyacetal resin.

Although the reason why the cracking at the time of etching can be prevented is not known clearly, it seems to be as follows. When a salt of a metal belonging to Group II of the Periodic Table is added to a polyacetal resin, the composition obtained is rigid and has an increased internal strain. When the above-mentioned component (c) is added thereto, the internal strain becomes smaller or disappears owing to a plasticizer-like action of component (c), so that the formation of cracks can be prevented.

Although the amount of component (c) used in this invention varies depending on its kind, it is preferably used in an amount of about 0.01 to about 20 parts by weight and more preferably in an amount of about 0.01 to about 15 parts by weight per about 100 parts by weight of polyacetal resin. If its amount is less than about 0.01 part by weight, the abovementioned effect is not achievable. If its amount exceeds about 20 parts by weight, the overall strength and other characteristic properties of the composition are deteriorated.

The polyacetal resin used in this invention may be a homopolymer, i.e. a polymer obtainable by polymerizing formaldehyde or trioxan (including those subjected to the end group stabilization treatment) or binary, ternary or higher order copolymers obtained by copolymerizing trioxan with comonomers such as a cyclic ether, cyclic acetal or the like.

It is allowable to add, to the composition of this invention, various additives usually added to polyacetal resin such as heat stabilizers, antioxidants, ultraviolet absorbers, antistatic agents, crystal-nucleating agents, pigments and the like.

In obtaining the composition of this invention, it is preferable to blend together the constitutional components by the use of an apparatus conventionally employed for kneading resin melts, such as kneader a, roll mill, extruder and the like. From the viewpoint of interception the of oxygen and the work environment, the use of an exbruder is most recommendable.

The temperature of blending is not lower than the melting point of polyacetal resin used. This is determined from the necessity to effect the blending of polyacetal resin uniformly in a molten state. The upper limit of the temperature is usually restricted by the stability of used polyacetal resin to thermal decomposition, and the blending is usually carried out at about 250° C. or below, preferably at about 230° C. or below.

Component (c) used for the sake of heat stabilization and prevention of crack, such as unsaturated polyester, may be directly blended as a polymer or a copolymer, or it may be added in the state of a monomer or a prepolymer and then polymerized in an extruder. In the case of thermosetting type of polymers, the latter method is more preferable.

From the viewpoint of producing a composition of uniform quality, it is preferable to first subject the individual constitutional components to a preliminary blending by means of a tumbler or Henschel mixer. Further, from the viewpoint of stabilizing the feed into an extruder, it is more preferable to use the polyacetal resin in a powdered state. However, these are not indispensable conditions.

In the above-mentioned method in which a monomer or a prepolymer is added, it is preferable to keep the temperature of preliminary blending at a value which causes no polymerization.

In the above-mentioned method in which a monomer or a prepolymer is added, a temperature of about 190° C. and a duration of about 1 to about 10 minutes are necessary as an example of the conditions of heating sufficient to polymerize them, though the conditions may vary depending on the kind of monomer or prepolymer. Such conditions are attainable in most cases by combining the temperature and duration conventionally employed for blending a polyacetal resin composition by means of a conventional extruder (they are dependent on the speed of extrusion), and no auxiliary heating means is necessary. In this invention, the heating means itself is not limited.

It is also permissible to incorporate a polymerization initiator into the composition.

By the above-mentioned heating, the monomer or prepolymer added is brought into polymerization. At this time, there are many methods for ascertaining that nothing is left unreacted. Among them, a simple method is to note the odor of the mixture just after being heated and extruded (usually pellet-formed). Another method adoptable is to dip the pellet in a solvent and to check the extraction of unreacted matter by means of infrared spectroscopy.

The pellet of polyacetal resin composition of this invention, produced by the above-mentioned process, is then molded into any desired shape by the conventional molding means such as injection molding, extrusion molding, compression molding or the like. Said molded product has an excellent surface processability. It is subjected to a surface roughening treatment with an appropriate solution as mentioned later, after which it is put to use by electro-plating, coating or the like to display its excellent characteristic properties.

As the appropriate solution used for the surface roughening treatment of the molded product obtained from the polyacetal resin composition of this invention, any solution may be used so far as it is an acidic solution or an oxidant solution capable of decomposing the metallic salt present in the composition. From the viewpoint of workability, less volatile solutions such as an aqueous solution of sulfuric acid, mixed aqueous solution of sulfuric acid and phosphoric acid, mixed aqueous solution of sulfuric acid and potassium bichromate and the like are used.

When the polyacetal resin is constituted of a copolymer, the surface roughening can sufficiently be carried out with an aqueous solution of sulfuric acid, mixed aqueous solution of sulfuric acid and potassium bichromate, or the like. When the polyacetal resin is constituted of a homopolymer, there is an intense tendency that the roughening of the surface progresses in an ideal manner. When a mixed aqueous solution of sulfuric acid and phosphoric acid is used, the roughening of the surface progresses satisfactorily whether the polyacetal is a copolymer or a homopolymer, though the progress is particularly satisfactory in the case of a homopolymer. When a mixed aqueous solution of sulfuric acid and phosphoric acid is used, the proportion defined by the range shown in the attached drawing is preferable. Hereunder, using 96% sulfuric acid and 85% phosphoric acid, this will be explained with reference to a sulfuric acid-phosphoric acid concentration diagram.

The scope of concentration of the aqueous etching solution used in this invention will be explained referring to FIG. 1 showing the area surrounded by the straight line connecting the 100% point of 96% sulfuric acid on the abscissa and the 100% point of 85% phosphoric acid on the ordinate and the two axes. This area can be divided into the following parts:

(1) The left-side part of line a: Adhesion force, i.e. the peeling strength (kg/cm) of the plated metal layer formed after etching and by subsequent plating process, is as low as less than 1 kg/cm. In the figure, this corresponds to the low sulfuric acid concentration region residing in the left side of the line a denoting 15% by weight of 96% sulfuric acid.

(2) The under-side of line b: The etching time for giving maximum adhesion is too long (more than 150 minutes is necessary at 40° C.) so that productivity is poor. In the figure, this corresponds to the region residing in the left-down side of the straight line b connecting the 35% by weight point of 96% sulfuric acid and the 45% by weight point of 85% phosphoric acid.

(3) The upper-side of line c: The etching time for giving maximum adhesion is too short (1 minute or less at 40° C.) so that stability is poor. In the figure, this corresponds to the region residing in the right-upper side of the straight line c connecting the 75% by weight point of 96% sulfuric acid and the 90% by weight point of 85% phosphoric acid.

All the above-mentioned regions (1), (2) and (3) are unemployable industrially, and the region other than (1), (2) and (3), i.e. the shadowed region which is surrounded by lines a, b and c in the figure, is the industrially employable region of this invention. When expressing the contents of said 96% sulfuric acid and 85% phosphoric acid by "x" and "y", respectively, the shadowed region is the range limited by the formulae, $x \geq 15$, $y \geq -(9/7)x + 45$ and $y \leq -(6/5)x + 90$.

Further, an aqueous solution having the total content of said 96% sulfuric acid and 85% phosphoric acid being 45 to 75% by weight and the content of said 96% sulfuric acid being 15% by weight is preferable, and furthermore, in the shadowed region, the upper side ($y \geq (1/7)x - (20/7)$) of the straight line d connecting the point of 20% by weight of 96% sulfuric acid and the point of 90% by weight of 96% sulfuric acid and 10% by weight of 85% phosphoric acid is particularly preferable.

The sulfuric acid and the phosphoric acid used in this invention may be the usual commercially available ones. As to sulfuric acid, that having a concentration of 96% is usually available, while as to phosphoric acid that having a concentration of 85% is usually available. The concentration area of this invention has been determined on these bases. When sulfuric acid and/or phosphoric acid having a different concentration is to be used, it is necessary to use the acid or acids after re-calculation on the basis of its actual concentration.

Next, as examples of use of the molded product obtained from the composition of this invention, an electroplating process and coating process will be illustrated.

The electroplating of molded plastic articles has extensively been known hitherto and is industrially employed in the case of ABS or the like. These disclosed processes may also be applied to the electroplating of the polyacetal resin composition of this invention. For example, each process is carried out in the following manner according to the description of Modern Plastics Encyclopedia, pp. 1019–1021 (1967):

(1) Defatting of molded article: The object of this process is to remove the fat of the human hand or the mechanical oil adhering on the surface of molded articles. This is carried out by dipping or vapor defatting with 1,1,1-trichloroethane. Defatting with conventional detergents is also possible.

(2) Surface roughening: A molded article is immersed in the above-mentioned acid. Though the conditions of immersion vary with the kind of molded article and the composition of the acid, the combination of temperature and time is selected so that the final plated product can have an excellent appearance (specular character) and around maximum and stable peeling strength. Some examples are shown in the Examples hereinbelow.

(3) Endowment of electrical conductivity (sensitizing, activation and nonelectrode plating); The roughened surface thus obtained is dipped in an aqueous HCl solution containing $SnCl_2$ and then in an aqueous HCl solution containing $PdCl_2$. According to a more preferable process, it is dipped in a mixed aqueous HCl solution containing $SnCl_2$ and $PdCl_2$ in one step. Thus, nuclei of Pd are deposited on the roughened surface, around which a thin layer of nickel is formed chemically at the next process. Thus, an electrical conductivity is given to the surface of the molded article.

(4) Electroplating: Electroplating is carried out to a thickness fit for the use according to the usual method in the order of, for example, Cu/Ni/Cr.

It is considered that the surface coatability of the molded articles of not only polyacetal resin but also other plastics is generally dependent on the chemical properties of the surface such as the kind of polar group on the surface and particularly on the physical properties of the surface such as the shape and distribution of convex and concave configurations and the like. If the polyacetal resin composition of this invention is used, an etched surface having an ideal irregular state can be obtained as stated below. This will be explained below referring to the accompanying drawings.

Figure 2:
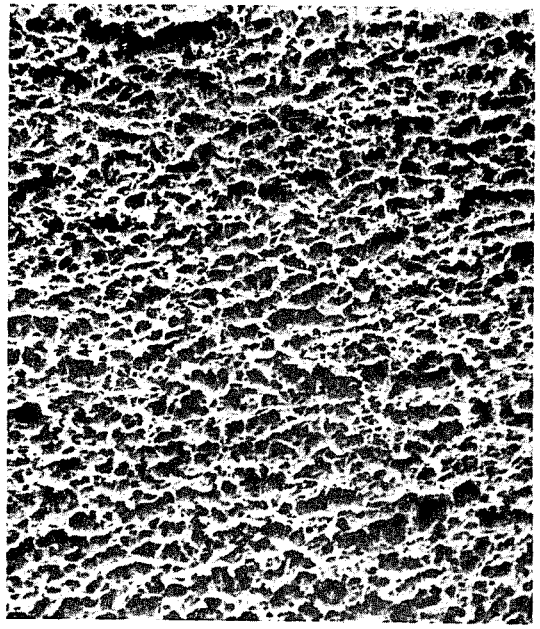
FIG. 2 is a microphotograph (magnification 1,000) of a surface-treated article of polyacetal resin according to a conventional process.

FIG. 2 is a microphotograph (magnification 1,000) of an article of polyacetal resin surface-treated according to a conventional process, i.e. a product obtained by immersing Tenac 5010 ® (polyacetal homopolymer manufactured by Asahi Kasei Kogyo K.K.) in 85% phosphoric acid at room temperature for 40 minutes. It seems, of course, very difficult to quantitatively express the chemical properties of such a treated surface, and it is also quite difficult to directly measure and quantitatively express the shapes of the convexes and concaves per se as material properties, i.e. in terms of sizes of convexes and concaves (for example, widths, depths, diameters, etc.) and their distributions.

The present inventors have conducted extensive studies on the method for expressing the state of the convexes and concaves of the surface not in the form of numerical figures directly denoting the shape but in other appropriate quantitative forms. As a result, the amount of chemical nickel deposited was first used as a value for expressing the surface area of the roughened surface. This value is determined by the following method:

A polyacetal resin is injection-molded into a plaque according to ASTM D-790. It is subjected to the prescribed surface roughening treatment and then neutralized, washed with warm water and air-dried. The sample thus obtained is immersed at 25° C. for 4 minutes in a solution prepared by adding water to a mixture of 0.2 g of $PdCl_2$, 20 g of $SnCl_2.2H_2O$ and 200 ml of 35% HCl which are catalyst-imparting agents for plastic plating so as to make the total volume 1 liter. The sample is washed with water, immersed in 12% aqueous solution of HCl at 25° C. for 5 minutes, and finally immersed in a chemical nickel solution comprising:

NAIKO SP (A) type (manufactured by KIZAI Co.): 1 part by volume

NAIKO SP (B) type (manufactured by KIZAI Co.): 1 part by volume

Water: 6 parts by volume at 40° C. for 10 minutes to deposit chemical nickel on the surface of the plaque sample.

Then, the chemical nickel deposited is completely eluted by treating it, for example, with an aqueous solution of ammonium persulfate at 100° C. for 10-30 minutes, and the amount of the nickel eluted is determined by a chelate titration with ethylenediaminetetracetic acid (EDTA). The nickel weight obtained is divided by the surface area of the plaque sample (the surface area being determined by multiplying the longitudinal length by the width), and the quotient obtained is used as the amount of chemical nickel deposited ($mg/dm^2$).

Since it is known that this deposition of chemical nickel takes place approximately uniformly on the convex-concave surface of polyacetal resin so as to give a thickness of about $1\mu$, this amount of the chemical nickel deposited is a characteristic value accurately expressing the surface area of the convex-concave surface of the resin.

Figure 4:
FIGS. 4(a) and 4(b) are cross-sectional views illustrating the kinds of convex and concave configurations on the surface as models.

However, the surface-coatability of a resin cannot be specified by only the value of the surface area. That is, surfaces having an equal surface area ($mg/dm^2$) can be greatly different from each other in surface-coatability, i.e. adhesion (by the anchor effect) of plating film or the like depending on the shape of the convexes and concaves on said surfaces. For example, considering the models of FIGS. 4(a) and 4(b), the convex-concave state of surface (a) should be much superior in anchor effect to the convex-concave state of surface (b) even if it is assumed that both the surfaces are identical in surface area. Further, the adhesion of plating film or the like should also vary depending on the chemical affinity of the surface (for example, the amount of polar group, or the like).

The present inventors have adopted the following peeling strength of plated metal layer as a value which synthetically and directly represents the physical properties (relative to anchor effect) and chemical properties of these convexes and concaves on the resin surface.

This peeling strength of a plated metal layer can be determined in the following manner:

A flat plate of polyacetal resin having a thickness of 3 mm is prepared by injection molding. The flat plate is defatted with 1,1,1-trichlorethane, its surface is subjected to a prescribed chemical treatment, and then neutralized, washed with water and air-dried. The flat plaque is chemically plated according to the aforementioned process and then immediately subjected to electroplating with copper so as to give a mean plating film thickness of about $40\mu$. Parallel nicks are made on the plated metal surface at a distance of 10 mm, and the plated metal layer between the nicks is pulled in the direction perpendicular to the surface of the flat plate. The stress required therefor is measured and taken as the peeling strength of the plated metal layer (kg/cm).

In this invention, it is intended to define the surface state of a molded article of polyacetal resin by the above-mentioned amount of chemical nickel deposited and the peeling strength of the plated metal layer. That is, the amount of chemical nickel deposited is considered to represent the extent of increase in surface area owing to the convexes and concaves of the surface, while the peeling strength of the plated metal layer is considered to represent synthetically the shape of the convexes and concaves, their distribution and the chemical properties of the convex-concave surface. Therefore, it is considered that the surface-coatability of a molded article of polyacetal resin can be represented by these two characteristic values.

With the above-mentioned considerations, the present inventors have measured the surface characteristics of a molded article comprising the polyacetal resin composition of this invention. As a result, it has been found that said molded article has improved characteristics entirely different from those of the conventional molded articles. That is, if a molded article comprising the polyacetal resin composition of this invention is etched by a preferable process, its surface has no surface crack noticeable to the naked eye, the amount of chemical nickel deposited is 85-150 $mg/dm^2$ and the peeling strength of the plated metal layer is about 1.0 kg/cm or above and usually in the range of about 1.5 kg/cm to about 2.5 kg/cm.

As shown in the Comparative Example mentioned hereinafter, the hitherto known molded articles of polyacetal resin having such a surface state as shown in FIG. 2 (microphotograph) all have an amount of chemical nickel deposited of 80 $mg/dm^2$ or less and a peeling strength of plated metal layer of 1.0 kg/cm or less. In the conventional surface treating systems (involving both polyacetal resin and conditions of surface treatment), there can be obtained no treated product, whose amount of chemical nickel deposited and peeling strength of plated metal layer exceed the above-mentioned values, even if the molded article is subjected to so severe a treatment as to yield cracks noticeable to the naked eye on the treated surface within the industrially adoptable treatment time. Further, if the surface of the molded article of polyacetal resin is made irregular by a mechanical treatment using, for example, sand paper or the like, the amount of chemical nickel deposited exceeds 85 $mg/dm^2$ and easily reaches the scope of this invention. In this case, however, the convex-concave state of the surface is nothing more than a mere increase in surface area and has no ability to increase the anchor effect, so that the peeling strength of the plated metal layer is still far lower than 1.0 kg/cm.

Figure 3:
FIG. 3 is a microphotograph (magnification 1,000) of a surface-treated article of polyacetal resin of this invention.

On the other hand, the etched surface of the novel molded polyacetal resin article of this invention has a state as indicated by the microphotograph of FIG. 3 (magnification 1,000) where the amount of chemical nickel deposited is 85-150 $mg/dm^2$, preferably 95-130 $mg/dm^2$, and the peeling strength of the plated metal layer is much higher than 1.0 kg/cm, for example, about 2.5 kg/cm. Furthermore, this molded article has no surface crack noticeable to the naked eye at all.

As mentioned above, the etched surface of the molded article comprising the polyacetal resin composition of this invention has ideal convexes and concaves. The etching process mentioned herein is one of the preferable examples of the process for etching said molded article. So long as said molded aritcle is used, it is possible to develop the above-mentioned surface characteristics even if other various etching processes are employed.

The etched article also shows a surprising effect in the case of other than metal plating, namely in the case of coating or an adhesion with adhesive, which demonstrates the usefulness of the polyacetal resin composition of this invention.

Next, the coating process will be illustrated. The molded article is defatted and surface-roughened by the same or a similar process as in electroplating, after which the surface is thoroughly dried. Then general coating materials are applied and baked for a predetermined period of time.

DESCRIPTION OF THE PREFERRED EMBODIMENTS

This invention will be illustrated more concretely by the following Examples, which are only by way of illustration and not by way of limitation.

EXAMPLES 1-13 AND COMPARATIVE EXAMPLES 1-2

100 parts by weight of polyacetal resin "Tenac® 5010" (manufactured by Asahi Kasei Kogyo Kabushiki Kaisha, acetal homopolymer, general grade) was mixed with 8.7 parts by weight of finely powdered calcium carbonate (manufactured by Shiraishi Calcium Co., average particle size 1.25 microns) and a quantity as shown in Table 1 of component (c) compound by means of a tumbler, after which the mixture was kneaded and pelletized by means of an extruder set at 190° C. By using the pellet, its heat stability was measured and, at the same time a plaque of ⅛″ thick was prepared by injection molding as a sample material.

The plaque was defatted with 1,1,1-trichloroethane and then etched by dipping it in a solution comprising 96% sulfuric acid/85% phosphoric acid/water=40/25/35 (wt%) at 40° C. for 8 minutes.

Then, the etched plaque was plated in the usual manner. That is, it was dipped for a predetermined period of time in a pretreatment solution for plastic plating (manufactured by Okuno Seiyaku Kogyo Co., "Catalyst") and then an accelerator (10% aqueous solution of hydrochloric acid), after which it was chemically plated with a chemical plating solution (manufactured by Okuno Seiyaku Kogyo Co., TMP chemical nickel plating solution) according to the noted method and then immediately subjected to electroplating. The average thicknesses of the plated metal layers were copper 40 microns, nickel 10 microns and chromium 0.1 micron. Performances of the plated product thus obtained were as shown in Table 1. The performances were measured by the following methods:

(1) Peeling strength of plated product: Two parallel breaking lines, 10 mm apart, were drawn on the plated surface, and the plated metal layer between the breaking lines was stretched to the right angle direction of the flat plate to measure the stress necessary for peeling.

(2) Appearance of plated product: Under a light source of 300 luxes or more, the appearance was examined with the naked eye at a distance of 60 cm from the test surface. The criterion of the evaluation was as shown in the footnote of Table 1.

As is understandable from Table 1, the polyacetal resin composition of this invention is improved in heat stability and excellent in plating characteristics.

TABLE 1

| | Comparative Example 1 | Comparative Example 2 | Example 1 | 2 | 3 | 4 | 5 | 6 | 7 | 8 | 9 | 10 | 11 | 12 | 13 |
|---|---|---|---|---|---|---|---|---|---|---|---|---|---|---|---|
| Polyacetal resin (Tenac ® 5010) (parts by wt.) | 100 | 100 | 100 | 100 | 100 | 100 | 100 | 100 | 100 | 100 | 100 | 100 | 100 | 100 | 100 |
| Calcium carbonate (av. particle size 1.25μ) (parts by wt.) | 0 | 8.7 | 8.7 | 8.7 | 8.7 | 8.7 | 8.7 | 8.7 | 8.7 | 8.7 | 8.7 | 8.7 | 8.7 | 8.7 | 8.7 |
| Compound | | | Unsaturated polyester (Note 5) | Methyl acrylate | Ethyl acrylate | Methyl methacrylate | Ethyl methacrylate | Acrylamide | Methacrylamide | Triallyl cyanurate (Note 3) | Diallyl phthalate (Note 3) | Vinyl acetate | Divinylbenzene | Polyvinyl acetate (Note 4) | Unsaturated polyester Acrylamide |
| (parts by wt.) | | | 0.87 | 0.01 | 0.76 | 0.87 | 0.01 | 0.87 | 0.87 | 6.10 | 0.87 | 0.87 | 0.87 | 0.87 | 0.50 0.40 |
| Heat stability (Note 1) | 0 | 0 △ | ◎ | | | | | ◎ | ◎ | | | | | ◎ | ◎ |
| Residual unreacted compound Method of detection (solvent extraction or odor) | — | — | None (Methanol toluene) | None (Methanol) | None (Methanol) | None (Methanol) | None (Methanol) | None (odor) | None (odor) | None (odor) | None (odor) | None (odor) | None (odor) | — | None (odor) |
| Appearance of plated product (Note 2) | x | x | | | | | | | | | | | | | |
| Peeling strength of plated product (kg/cm) | 0.2 | 2.2 | 2.3 | 1.6 | 1.8 | 1.7 | 1.6 | 2.0 | 2.1 | 1.8 | 1.6 | 1.7 | 2.1 | 2.2 | 2.1 |

(Note 1)
◎ Injection molding can be carried out quite satisfactorily under usual conditions.
○ Injection molding is possible without practical problems though the range of suitable conditions is somewhat narrow.
△ At the time of injection molding, streaks are formed due to decomposition of resin.
x Extrusion is impossible.

(Note 2)
Appearance was evaluated by the naked eye according to the following criterion:
◎ The so-called mirror surface having no crack.
○ No reflected image of face; no crack.
△ Obscure image though the face is reflected; no crack.
x No reflected image of face; crack formed.
(In the following Tables, same symbols as above have the same meanings as above.)

(Note 3)
0.20 part by weight (Example 8) and 0.04 part by weight (Example 9) of 2,5-dimethyl-2,5-di(t-butylperoxy)-hexane was added as polymerization initiator.

(Note 4)
Degree of polymerization 200 (Nihon Gosei Kagaku Kogyo Co.); the other compounds were of chemically pure grade.

(Note 5)
Upica ® CLC-834 (manufactured by Toyo Boseki Co.)

EXAMPLES 14-17 AND COMPARATIVE EXAMPLES 3-4

100 Parts by weight of polyacetal resin "Tenac ® 5010" was mixed with 8.7 parts by weight of magnesium carbonate (average particle size 2-3 microns), barium carbonate (average particle size 2 microns), barium acetate (average particle size 3 microns) or calcium hydrogen phosphate (average particle size 2-3 microns) in place of the calcium carbonate, and as a reactive compound, a certain quantity of unsaturated polyester [a mixture comprising 70 parts by weight of a polyester prepolymer, which was produced from isophthalic acid/maleic anhydride/diethylene glycol (=1 mole/1 mole/2 moles) and having an average polymerization degree of 10, and 30 parts by weight of styrene as crosslinking agent] by means of a tumbler, after which the mixture was kneaded and pelletized by means of an extruder in the same manner as above.

The heat stability of this pellet was measured and, at the same time, a plaque was made therefrom and plated by the same process as in Example 1 to investigate the performances of the plated product.

Heat stabilities of these polyacetal resins compositions and the performances of the plated products were as shown in Table 2.

(All the above-mentioned metallic salts were of chemically pure grade. Barium acetate was used after pulverization in a mortar, while the others were used as they were.)

TABLE 2

|  | Comparative Example 3 | Example 14 | Comparative Example 4 | Example 15 | Example 16 | Example 17 |
|---|---|---|---|---|---|---|
| Polyacetal resin (Tenac ® 5010) (parts by wt.) | 100 | 100 | 100 | 100 | 100 | 100 |
| Magnesium carbonate (Av. particle size 2-3μ) (parts by wt.) | 8.7 | 8.7 | — | — | — | — |
| Barium carbonate (Av. particle size 2μ) (parts by wt.) | — | — | 8.7 | 8.7 | — | — |
| Barium acetate (Av. particle size 3μ) (parts by wt.) | — | — | — | — | 8.7 | — |
| Calcium hydrogen phosphate (Av. particle size 2-3μ) (parts by wt.) | — | — | — | — | — | 8.7 |
| Unsaturated polyester (parts by wt.) | — | 8.7 | — | 10.0 | 0.15 | 0.87 |
| Extrudability | Violent foaming | Good | Violent foaming | Good | Good | Good |
| Heat stability | x | — | x | — | — | — |
| Appearance of plated product | — | — | — | — | — | — |
| Peeling strength of plated metal layer (kg/cm) | — | 1.8 | — | 1.7 | 1.6 | 1.7 |

EXAMPLES 18-20 AND COMPARATIVE EXAMPLES 5-6

100 Parts by weight of polyacetal resin "Tenac ® 5010" was mixed with 11.1 parts by weight of calcium carbonate (manufactured by Shiraishi Calcium Co.) having the various average particle sizes shown in Table 3 and 1.1 parts by weight of unsaturated polyester (manufactured by Toyo Boseki Co.). The resin composition obtained was plated by the same method as in Example 1, and the performances of the plated products were investigated.

Performances of these plated products were as shown in Table 3.

TABLE 3

| No. | Comparative Example 5* | Example 18 | Example 19 | Example 20** | Comparative Example 6 |
|---|---|---|---|---|---|
| Average particle size of calcium carbonate (micron) | 0.08 | 1.0 | 1.25 | 3.6 | 5.0 |
| Heat stability | x | ⊚ | ⊚ | ⊚ | |
| Appearance | — | | | Δ | x |
| Peeling strength (kg/cm) | — | 2.0 | 2.0 | 1.5 | 1.0 |

*Extrusion was impossible.
**It is applicable to uses for which good appearance is not necessarily required.

EXAMPLES 21-23 AND COMPARATIVE EXAMPLE 7

The same etched plaque as in Table 3 was used. After being etched, it was thoroughly washed with water, air-dried, coated with an acrylic coating material (manufactured by Tokyo Paint Co.) and then baked at 150° C. for 30 minutes. Adherence of coated film was tested by pressing a strip of pressure sensitive transparent adhesive tape over an area of the surface which was cross hatched with ⅛" squares and then stripping the tape away. The results are shown in Table 4.

TABLE 4

| No. | Example 21 | Example 22 | Example 23 | Comparative Example 7 |
|---|---|---|---|---|
| Average particle size of calcium carbonate (micron) | 1.0 | 1.25 | 3.6 | 5.0 |
| Adherence of coating film | ⊚ | ⊚ | | x |
| Gloss | Glossy | Glossy | Glossy | Not glossy |

Criterion for the evaluation of adherence test:
⊚ No change occurs at all.
○ Partial peeling occurs at corner parts.
x Percentage of peeled squares is 20% or less.
xx Almost all the squares are peeled.

EXAMPLES 24-27 AND COMPARATIVE EXAMPLES 8-10

Using the same calcium carbonate as in Example 1 (average particle size 1.25 microns), plating was carried out by the same method as in Example 1, provided that the amount of calcium carbonate was varied as shown in Table 5 and unsaturated polyester was added in an amount corresponding to 10% of the amount of calcium carbonate (parts by weight). The results are shown in Table 5.

TABLE 5

| No. | Comparative Example 8 | Comparative Example 9 | Example 24 | Example 25 | Example 26 | Example 27 | Comparative Example 10 |
|---|---|---|---|---|---|---|---|
| Polyacetal resin (Tenac ® 5010) (parts by wt.) | | | | 100 | | | |
| Calcium carbonate (Av. particle size 1.25μ) (parts by wt.) | 0 | 1 | 3.1 | 8.7 | 17.6 | 25.0 | 42.9 |
| Unsaturated polyester (parts by wt.) | 0 | 0.1 | 0.31 | 0.87 | 1.76 | 2.5 | 4.3 |
| Heat stability | ◎ | ◎ | ◎ | ◎ | ○ | | x |
| Performances before plating | | | | | | | |
| Tensile strength (kg/cm²) | 700 | 700 | 690 | 650 | 600 | 580 | — |
| Tensile elongation (between chucks, %) | 18 | 17 | 16 | 12 | 9 | 8 | — |
| Flexural strength (kg/cm²) | 1,050 | 1,050 | 1,040 | 1,040 | 1,030 | 1,020 | — |
| Izod impact strength (notched, kg · cm/cm) | 6 | 6 | 5 | 5 | 4 | 4 | — |
| Appearance of plated product | x | x | | | | | — |
| Peeling strength of plated metal layer (kg/cm) | 0.7 | 0.9 | 1.5 | 2.3 | 2.3 | 2.0 | — |

(Note) In Comparative Example 10, the resin decomposed when extruded.

EXAMPLES 28–31 AND COMPARATIVE EXAMPLES 11–12

The experiment of Examples 25–27 and Comparative Example 8 was repeated, except that "Duracon ®M90-02" (manufactured by Polyplastics Co., acetal copolymer, general grade) was used as the polyacetal resin. The results are shown in Table 6.

TABLE 6

| | Comparative Example 11 | Example 28 | Example 29 | Example 30 | Example 31 | Comparative Example 12 |
|---|---|---|---|---|---|---|
| Polyacetal resin (Duracon ® M90-02) (parts by wt.) | 100 | 100 | 100 | 100 | 100 | 100 |
| Calcium carbonate (Av. particle size 1.25μ) (parts by wt.) | 0 | 8.7 | 17.6 | 25.0 | 33.3 | 42.9 |
| Unsaturated polyester (parts by wt.) | 0 | 0.87 | 1.76 | 2.50 | 3.33 | 4.29 |
| Heat stability | ◎ | ◎ | ◎ | ◎ | ○ | Δ |
| Appearance of plated product | | | | | Δ | x |
| Peeling strength of plated metal layer (kg/cm) | 0.2 | 1.3 | 2.1 | 1.8 | 1.5 | 1.0 |

EXAMPLES 32–34 AND COMPARATIVE EXAMPLE 13

The experiment of Example 25 was repeated, except that the amount of unsaturated polyester was varied. The results are shown in Table 7.

TABLE 7

| | Example 32 | Example 33 | Example 34 | Comparative Example 13 |
|---|---|---|---|---|
| Polyacetal resin (Tenac ® 5010) (parts by wt.) | 100 | 100 | 100 | 100 |
| Calcium carbonate (Av. particle size 1.25μ) (parts by wt.) | 8.7 | 8.7 | 8.7 | 8.7 |
| Unsaturated polyester (parts by wt.) | 0.87 | 10 | 15 | 25 |
| Heat stability | ◎ | ○ | ○ | x |
| Tensile strength (kg/cm²) | 650 | 600 | 570 | 520 |
| Tensile elongation (between chucks, %) | 12 | 13 | 13 | 14 |
| Flexural strength (kg/cm²) | 1,040 | 900 | 850 | 740 |
| Izod impact strength (notched, kg-cm/cm) | 5 | 4 | 3 | 2 |

EXAMPLES 35–40 AND COMPARATIVE EXAMPLES 14–18

The same plaque having a thickness of 3 mm as in Example 1 was plated in the same manner as in Example 1, provided that the composition of the etching solution was varied as shown in Table 8. Peeling strengths of the plated metal layers obtained were as shown in Table 8.

TABLE 8

| | Example |
|---|---|

TABLE 8-continued

|  | 35 | 36 | 37 | 38 | 39 | 40 |
|---|---|---|---|---|---|---|
| 96% sulfuric acid/ 85% phosphoric acid (parts by wt.)* | 40/25 | 30/35 | 32/10 | 25/55 | 45/0 | 60/0 |
| Optimum etching time (40° C. × min.) | 8 | 8 | 70 | 3 | 50 | 4 |
| Peeling strength (kg/cm) | 2.2 | 2.0 | 1.6 | 2.0 | 1.5 | 1.6 |

|  | Comparative Example | | | | |
|---|---|---|---|---|---|
|  | 14 | 15 | 16 | 17 | 18 |
| 96% sulfuric acid/ 85% phosphoric acid (parts by wt.)* | 20/0 | 10/15 | 20/15 | 76/24 | 80/0 |
| Optimum etching time (40° C. × min.) | 800 | 1,000 | 600 | 1 | 1 |
| Peeling strength (kg/cm) | 1.0 | 0.4 | 1.1 | 1.9 | 1.4 |

*When the sum of parts by weight was less than 100, water was added until the total weight reached 100 parts by weight.

EXAMPLE 41

The same plaque having a thickness of 3 mm as in Example 29 was dipped in an etching solution having the following composition at 40° C. for 12 minutes and then subjected to electroplating by repeating the steps mentioned in Example 29. The peeling strength of the plated metal layer obtained was 1.3 kg/cm.

Composition of etching solution:
96% sulfuric acid: 55 parts by weight
potassium bichromate: 4 parts by weight
water: 45 parts by weight As is understandable from the examples mentioned above, the polyacetal composition of this invention is excellent in heat stability and, when its molded product is etched with an appropriate acid, it gives a molded product excellent in surface processability, so that the application field of the resin is further expanded. For example, such a resin can be substituted for metals for parts where both functional and decorative characteristics are required. Thus, the effect of weight reduction and cost saving is very great.

EXAMPLES 42–45 AND COMPARATIVE EXAMPLES 19–26

Three ingredients comprising 90 parts by weight of polyacetal resin "Tenac ®5010", 10 parts by weight of calcium carbonate having a particle size as shown in Table 1 and 1 part by weight of an unsaturated polyester (an unsaturated polyester having an average degree of polymerization of 10 synthesized from isophthalic acid/maleic anhydride/diethylene glycol=1 mole/1 mole/2 moles and containing styrene as a crosslinking agent) were premixed by means of a tumbler, after which the mixture was kneaded and pelletized by means of an extruder adjusted to 190° C. By using the pellet, plaques having a thickness of 3 mm were prepared by injection-molding as a sample material.

The plaque was annealed in a hot air oven at 150° C. for 30 minutes (it is hereinafter referred to as sample A) and then immersed in a solution comprising 96% sulfuric acid/85% phosphoric acid/water=40/25/35 (ratio by weight) at 40° C. for a predetermined period of time.

As a Comparative Example, "Tenac ®5010" was pelletized under the same conditions as above and then injection-molded to obtain a plaque having a thickness of 3 mm. The plaque was annealed at 150° C. for 30 minutes (it is hereinafter referred to as sample B) and then subjected to the following etching treatment:

(1) immersion in 85% by weight ortho-phosphoric acid at 25° C. for a predetermined period of time, (2) immersion in a chromic acid-sulfuric acid mixture comprising 96% sulfuric acid/potassium bichromate/water=100/15/50 (ratio by weight) at 60° C. for a predetermined period of time, or (3) physical surface treatment with sand paper.

After the etching treatment, the samples of the above-mentioned Example and Comparative Example were immersed in a 3% aqueous solution of sodium hydroxide at room temperature for several seconds and then immersed in hot water at 80° C. for 10 minutes to complete the etching treatment. (Sample B was further dried in hot air at 150° C. for 30 minutes, after the above-mentioned washing with hot water.)

Then, the gloss of the samples was measured according to the method mentioned hereinafter. The results are shown in Table 9.

On the samples, chemical nickel was deposited by the above-mentioned method and its amount was determined. The results are shown in Table 1.

After the deposition of chemical nickel, the peeling strength of the plated metal layer was measured by the above-mentioned method, and an electrical plating with copper, nickel and chromium was carried out separately. The average thickness of the plated metal layer was Cu/Ni/Cr=about 25μ/10μ/0.1μ. The plated product was subjected to an appearance test and a heat cycle test. The results are shown in Table 9.

In Table 9 (and in Table 10), the term "gloss" means a value which has been determined by forming ASTM D-790 plaque by injection-molding, subjecting the plaque to the prescribed surface roughening treatment, neutralizing it, washing it with warm water, air-drying it, measuring its gloss at three points per one plaque by means of a gloss meter manufactured by Nippon Denshoku Kogyo Co., Ltd. and calculating the mean value. The angle of incident light used for the measurement and the angle of detection are both 75° C. Before the measurement, the surface of the plaque is cleanly wiped with a gauze to remove dust therefrom.

The appearance of the plated article is evaluated with the naked eye under a light source of 300 luxes or more at a distance of 60 cm from the test surface, and the noted symbols have the following meanings:

◎ The so-called mirror surface,
o Obscure image though the face is reflected,
x No reflected image of face.

The heat cycle test of the plated articles has been carried out by subjecting a plated article to a four-cycle treatment, the one cycle of which comprises the following steps: [−30° C., 60 minutes]→[room temperature, 15 minutes]→[90° C., 60 minutes]→[room temperature, 15 minutes], and observing and evaluating the state of blisters on the plated surface. The symbols have the following meanings:

o No change,
Δ Partial occurrence of blister,
x Occurrence of blister over the whole surface.

TABLE 9

| | Comparative | | Comparative |
|---|---|---|---|

TABLE 9-continued

|  | Example 19 | Example 42 | Example 43 | Example 44 | Example 45 | Example 20 |
|---|---|---|---|---|---|---|
| Sample | A | | | | | B |
| Etching conditions | | | | | | |
| Composition of solution | Sulfuric acid/Phosphoric acid | | | | | Phosphoric acid |
| Condition (°C.) | 40 | 40 | 40 | 40 | 40 | 25 |
| for immersion (min.) | 3 | 5 | 8 | 10 | 15 | 40 |
| Amount of chemical nickel deposited (mg/dm²) | 69 | 95 | 115 | 122 | 132 | 70 |
| Gloss (%) | 62 | 45 | 27 | 21 | 7 | 67 |
| Peeling strength of plated metal layer (kg/cm) | 0.6 | 1.7 | 2.3 | 2.0 | 1.0 | 0.7 |
| Performances of plated article | | | | | | |
| Appearance | ◎ | ◎ | ◎ | | | ◎ |
| Heat cycle test | x | | | | | Δ |

|  | Comparative Example 21 | Comparative Example 22 | Comparative Example 23 | Comparative Example 24 | Comparative Example 25 | Comparative Example 26 |
|---|---|---|---|---|---|---|
| Sample | B | | B | | | B |
| Etching conditions | | | | | | |
| Composition of solution | Phosphoric acid | Chromic acid-sulfuric acid mixture | | | Physical treatment with sand paper | |
| Condition (°C.) | 25 | 60 | 60 | 60 | 50 times rubbed with #400 sand paper | 50 times rubbed with #40 sand paper |
| for immersion (min.) | 120 | 15 sec | 45 sec | 180 sec | | |
| Amount of chemical nickel deposited (mg/dm²) | 80 | 0 | 62 | 62 | 75 | 100 |
| Gloss (%) | 10 | 90 | 80 | 67 | 30 | 8 |
| Peeling strength of plated metal layer (kg/cm) | 0 | 0.9 | 1.0 | 0.1 | 0.1 | 0.2 |
| Performances of plated article | | | | | | |
| Appearance | | Note 1 | Note 2 | Note 3 | | |
| | | — | | x | x | x |
| Heat cycle test | x | Note 1 | x | Δ | x | x |
| | | — | | | | |

Note 1:
Evaluation was impossible because no plating layer was formed.
Note 2:
Slight surface crack was observed.
Note 3:
Marked surface crack was observed.

EXAMPLES 46 AND 47

The treatment of Example 2 was repeated, except that the calcium carbonate of sample A was replaced by a mixture thereof with magnesium carbonate having an average particle size of 2–3μ (it is hereinafter referred to as "sample C") and the Tenac ®5010 of sample A was replaced by its mixture with polyacetal resin "Duracon ®M90-02" (acetal copolymer manufactured by Polyplastics Co., Ltd., general grade) (sample D). The results are shown in Table 10.

TABLE 10

|  | Example 46 | Example 47 |
|---|---|---|
| Sample | C | D |
| Etching conditions | | |
| Composition of solution | Sulfuric acid/Phosphoric acid | |
| Conditions for (°C.) | 40 | |
| immersion (min.) | 8 | |
| Amount of chemical nickel deposited (mg/dm²) | 125 | 140 |
| Gloss (%) | 15 | 12 |
| Peeling strength of plated metal layer (kg/cm) | 1.8 | 1.3 |
| Performance of plated article | | |
| Appearance | ◎ | ◎ |
| Heat cycle test | | |

What is claimed is:

1. A process for roughening the surface of a molded product of a polyacetal resin composition excellent in heat stability and surface processability comprising (1) blending (a) about 100 parts by weight of polyacetal resin, (b) about 2 to about 35 parts by weight of a carbonate, phosphate or acetate of a metal belonging to Group II of the periodic table or a mixture thereof and (c) about 0.01 to about 20 parts by weight of a polymer, a copolymer or a mixture thereof of a compound selected from the group consisting of unsaturated polyester, alkyl ester of acrylic acid or methacrylic acid, amide of acrylic acid or methacrylic acid, triallyl cyanurate, diallyl phthalate, vinyl acetate and divinylbenzene; (2) molding the resulting polyacetal resin composition into the desired configuration; and (3) conditioning the resulting molded product by dipping said molded product in an aqueous solution containing sulfuric acid.

2. A process for roughening the surface according to claim 1, wherein said aqueous solution containing sulfuric acid has a sulfuric acid concentration of 35% by weight to 75% by weight.

3. A process for roughening the surface according to claim 1, wherein said aqueous solution containing sulfuric acid additionally contains phosphoric acid.

4. A process for roughening the surface of a molded product of polyacetal resin according to claim 3, wherein the composition of sulfuric acid, phosphoric acid and water is represented, in a sulfuric acid-phosphoric acid-water concentration diagram, by the region which is in the right side of line "a" expressing 15% by weight of 96% sulfuric acid, in the upper side of straight line "b" connecting the point of 35% by weight aqueous solution of 96% sulfuric acid and the point of 45% by weight aqueous solution of 85% phosphoric acid, and in the down side of straight line "c" connecting the point of 75% by weight aqueous solution of 96% sulfuric acid and the point of 90% by weight aqueous solution of 85% phosphoric acid.

5. A process for roughening the surface according to claim 1, wherein said aqueous solution containing sulfuric acid additionally contains potassium bichromate.

6. A process for roughening the surface according to claim 3, wherein the roughening is carried out with a solution having a composition of sulfuric acid/phosphoric acid/water=about 40/about 25/about 35, as expressed by parts by weight.

7. A process for roughening the surface according to claim 1, and further including the step of electroplating or painting said roughened surface.

8. A process for roughening the surface according to claim 1, and further including the step of coating said roughened surface.

9. A surface-treated polyacetal resin product, comprising (a) about 100 parts by weight of polyacetal resin, (b) about 2 to about 35 parts by weight of a carbonate, phosphate or acetate of a metal belonging to Group II of the Periodic Table or a mixture thereof and (c) about 0.01 to about 20 parts by weight of a polymer, a copolymer or a mixture thereof of a compound selected from the group consisting of unsaturated polyesters, alkyl esters of acrylic acid or methacrylic acid, amides of acrylic acid or methacrylic acid, triallyl cyanurate, diallyl phthalate, vinyl acetate and divinylbenzene, having no surface cracks noticeable to the naked eye and having surface characteristics such that when chemical nickel is deposited thereon by immersing the product in an aqueous chemical nickel solution at 40° C. for 10 minutes to deposit chemical nickel on the surface thereof, eluting the deposited chemical nickel from said surface, and determining the amount of chemical nickel eluted, the nickel weight obtained by dividing the area of the surface deposited with nickel to give the amount of chemical nickel deposited is 85-150 mg/dm$^2$ and wherein the peeling strength of a plated metal layer plated by chemically plating a nickel layer by means of a chemical nickel solution, then electroplating with copper so as to give a mean plating thickness of about 40μ, drawing at least two parallel breaking lines or nicks on the plated metal surface at a distance of 10 mm apart, pulling or stretching the plated metal layer between said lines or nicks in a direction perpendicular to said surface and measuring the stress necessary for peeling is 1.0 kg/cm or more.

10. A coated surface-treated polyacetal resin product comprising:

(a) a surface-treated polyacetal resin product having no surface cracks noticeable to the naked eye and having surface characteristics such that when chemical nickel is deposited thereon by immersing the product in an aqueous chemical nickel solution at 40° C. for 10 minutes to deposit chemical nickel on the surface thereof, eluting the deposited chemical nickel from said surface, and determining the amount of chemical nickel eluted, the nickel weight obtained by dividing the area of the surface deposited with nickel to give the amount of chemical nickel deposited is 85-150 mg/dm$^2$ and wherein the peeling strength of a plated metal layer plated by chemically plating a nickel layer by means of a chemical nickel solution, then electroplating with copper so as to give a mean plating thickness of about 40μ, drawing at least two parallel breaking lines or nicks on the plated metal surface at a distance of 10 mm apart, pulling or stretching the plated metal layer between said lines or nicks in a direction perpendicular to said surface and measuring the stress necessary for peeling is 1.0 kg/cm or more; and (b) a surface coating layer chemically plated and subsequently electroplated or coated on said surface-treated polyacetal resin product.

11. A coated surface-treated polyacetal resin product according to claim 10, wherein said surface coating layer is a member selected from the group consisting of metal, acrylic and adhesive.

* * * * *

UNITED STATES PATENT AND TRADEMARK OFFICE
CERTIFICATE OF CORRECTION

PATENT NO. : 4,521,488

DATED : June 4, 1985

INVENTOR(S) : Yoshihiro Hattori, et al

It is certified that error appears in the above-identified patent and that said Letters Patent is hereby corrected as shown below:

The term of this patent subsequent to August 7, 2001, has been disclaimed.

Signed and Sealed this

Seventeenth Day of September 1985

[SEAL]

Attest:

DONALD J. QUIGG

Attesting Officer

Commissioner of Patents and
Trademarks—Designate

UNITED STATES PATENT AND TRADEMARK OFFICE
CERTIFICATE OF CORRECTION

PATENT NO. : 4,521,488
DATED : June 4, 1985
INVENTOR(S) : Yoshihiro HATTORI et al It is certified that error appears in the above-identified patent and that said Letters Patent is hereby corrected as shown below:

Title page,

In category "[30] Foreign Application Priority Data" please insert the following:

--Apr. 14, 1980 [JP] Japan.........55-48005--

Signed and Sealed this

Fifth Day of November 1985

[SEAL]

Attest:

DONALD J. QUIGG

Attesting Officer

Commissioner of Patents and Trademarks